United States Patent [19]

Janes et al.

[11] 4,171,462
[45] Oct. 16, 1979

[54] LINEAR ELECTRON BEAM GUN EVAPORATOR HAVING UNIFORM ELECTRON EMISSION

[75] Inventors: George S. Janes, Lincoln; Leonard N. Litzenberger, Andover; Donald F. Twombly, Woburn, all of Mass.

[73] Assignee: Jersey Nuclear-Avco Isotopes, Inc., Bellevue, Wash.

[21] Appl. No.: 798,638

[22] Filed: May 19, 1977

[51] Int. Cl.² .................................. H01J 37/305
[52] U.S. Cl. .................................. 13/31 EB
[58] Field of Search .................. 13/31, 31 EB; 219/121 EB; 313/82; 250/423 P, 492 B, 396, 398

[56] References Cited

U.S. PATENT DOCUMENTS

| 3,655,903 | 4/1972 | Roman et al. | 13/31 |
| 3,748,365 | 7/1973 | Tsujimoto | 13/31 |

*Primary Examiner*—R. N. Envall, Jr.
*Attorney, Agent, or Firm*—Weingarten, Maxham & Schurgin

[57] ABSTRACT

A linear electron beam evaporation source for a high vapor temperature material such as uranium, the source being provided with a filamentary emitter and apparatus for controlling the filament electron emission to maintain an approximately constant current per filament unit length. A control structure is provided and operated to create a space charge in the vicinity of the electron emitting filament such that the current density of the electron beam is controlled by the space charge rather than the local electron emissivity along the length of the filament.

15 Claims, 3 Drawing Figures

LINEAR ELECTRON BEAM GUN EVAPORATOR HAVING UNIFORM ELECTRON EMISSION

FIELD OF THE INVENTION

This invention relates to electron beam evaporation techniques and, in particular, to a linear electron beam evaporator having a uniform electron emission which is constant at all points along the length of the gun.

BACKGROUND OF THE INVENTION

Electron beam evaporation sources have been used as a convenient means in recent years for evaporating high vapor temperature materials such as uranium and other refractive metal elements. Such a technique has been found to be useful for the evaporation of uranium in high quantities for production level isotope separation, as is discussed in commonly assigned U.S. Pat. Nos. 3,772,519 and 3,939,254, and Pat. No. 4,058,667. As used in such apparatus, it is preferable to employ a linear electron beam evaporation source as disclosed in the above-referenced application to provide a long line source of uranium vapor which flows radially outward from the line of vaporization, for subsequent isotopically selective ionization and separation. Such a vapor source is also preferably operated at a high vaporization rate for increased enrichment efficiency.

In order for an atomic laser isotope separation process to be efficiently performed, it has been found that it is generally necessary and desirable for the vapor density along any line parallel to the linear vapor source to be uniform. Since the vaporization rate varies exponentially with the surface temperature of the melt, this translates to a requirement that the current per unit length emitted by the electron beam gun be constant at all points along the length of the gun.

Experience has shown, however, that it is extremely difficult to maintain a uniform emitted electron beam current density over the length of the filament. One factor contributing to such difficulty is that portions of the surface of the filament may become coated with uranium (or other melt material), which results in increased electron emission from the affected region by virtue of a local decrease in the effective work function of the surface. This situation is aggravated further to the extent that the increased local current density results in a higher surface temperature for the adjacent portion of the melt, with consequent increased vaporization rates and even greater coating of the filament. Consequently, an unstable situation may result, wherein it is impossible to maintain uniformity of the emitted current per unit length along the electron gun's lengthwise dimension, even though the total current for the filament may be controlled by means of feedback circuitry. In one particular case, a condition of nonuniformity has been observed, so egregious that a portion of the electron beam bored a hole right through the melt, into the bottom of the crucible.

BRIEF SUMMARY OF THE INVENTION

In a preferred embodiment for the present invention, a linear electron beam vapor source is shown having a control element for establishing a space charge in the vicinity of the electron gun filament (or cathode), so that if the filament is sufficiently hot, the total current which can be emitted thereby per unit length is limited by the space charge, rather than local filament emissivity. Other parameters, such as accelerating voltage, the precise location of the control element, and the bias potential of such an element relative to the filament will affect both space charge and electron beam current. When the emitted electron current per unit length becomes principally limited by space charge, current density becomes relatively independent of filament temperature and coating. Further, since the control element used to establish the space charge will draw little or no current, it provides a stable, low power means for achieving a uniform current density.

In this particular implementation, a trough-shaped crucible is provided with a reservoir or a supply of high vapor temperature material, such as uranium metal, to be vaporized into a radially expanding vapor flow occupying a wide angle over the crucible. An elongate filament, placed to one side of the crucible and extending parallel thereto along the long dimension of the crucible, is operated as a source of electrons which are accelerated and focused onto a line along the long dimension of the surface of the uranium metal in the crucible. The electrons in the beam are accelerated by a potential between the filament and a nearby linear electrode. According to the present invention, a control rod is placed adjacent the filament and parallel thereto. A bias voltage is applied between the rod and the filament at a level to create a space charge which will render electron beam current per unit length relatively independent of filament emissivity. To prevent a reverse flow of ionized particles in the vapor from migrating into the region of the accelerating potential between the accelerating electrode and the filament, a further electrode may optionally be placed adjacent the accelerating electrode and just above it in the direction of the electron beam trajectory, biased to produce a reversal of field between it and the accelerating electrode, to shield against the reverse flow of ions into the accelerating potential between the accelerating electrode and the filament or cathode, as described in U.S. Pat. No. 4,058,667.

Emission current densities can be easily controlled by varying the potential on the rod, which requires relatively little power. Since a uniform electron beam current per unit length is provided by this structure, it is also possible to vary grid bias to adjust or stabilize beam current. Provision is also made for using multiple rod elements such as for introducing axial nonuniformities into the rod-to-filament potential.

BRIEF DESCRIPTION OF THE DRAWING

These and other features of the present invention are more fully described below in the detailed description of the preferred embodiment, and in the accompanying drawing of which.

DETAILED DESCRIPTION OF THE INVENTION

The present invention contemplates apparatus for maintaining a predetermined, typically constant, current per unit length from a linear electron beam gun. The emission of an approximately constant current per unit length from the filament or cathode of the electron beam gun is achieved by the use of a control rod structure positioned adjacent the filament or cathode and running parallel thereto, so that electron emission is controlled by a space charge which may be established in the vicinity of the rod, rather than by the emissivity of the filament.

Figure 1:
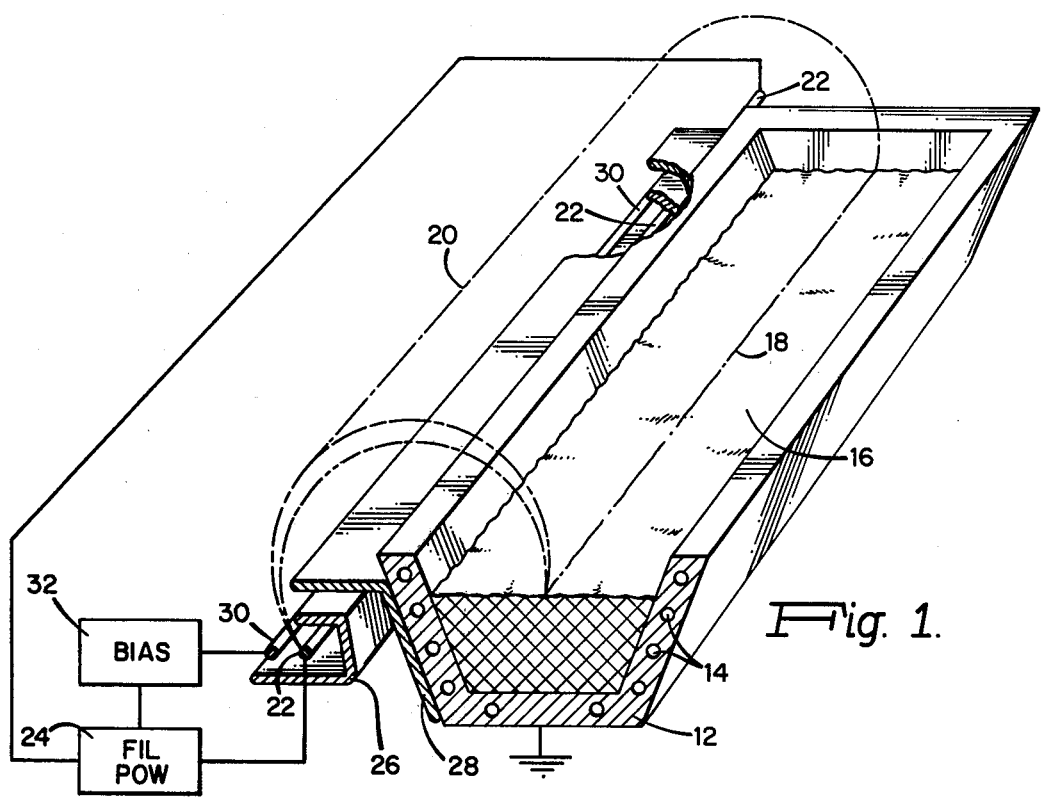
FIG. 1 is a sectioned perspective pictorial view of a linear electron beam evaporation source having a control grid element according to the present invention.

The structure of a preferred embodiment of the invention is shown in pictorial, schematic form in FIG. 1, with reference to which the invention may be described. Substantial latitude being intended in the structure for accomplishing the invention, it should be realized that the dimensions and arrangement of elements shown in FIG. 1 are to be viewed as exemplary only. As illustrated, a crucible 12, typically fabricated of copper, and having a plurality of cooling ports 14 for the circulation of water or other cooling material, contains a supply of material 16 such as uranium which is to be evaporated from a line 18 along the surface of the material. The heating at the line 18 which brings about the evaporation is generated by impinging upon line 18 an energized electron beam 20 which has, as shown, a generally cusp-shaped, arcuate cross-section and extends generally the entire lengthwise dimension of the crucible 12.

The electron beam 20 is generated from a filament 22 which is an elongated wire, typically of tungsten and of one or more millimeters in diameter and typically one meter or less in length. Filament 22 is supported at its ends by insulator brackets (not shown), and is energized by a filament power source 24 which supplies typically one kilowatt of heating current to the filament to raise its thermal energy to the point of substantial electron emission.

A beam forming electrode 26, which is preferred but optional, is provided for shaping the electrons emitted from the filament 22 into the beam 20. Beam forming electrode 26 has a generally L-shaped cross-section and a tip which confronts the beam 20 from the crucible side. Electrode 26 extends the length of the filament 22 and is, generally, at about the same potential as the filament; however, as in a variant embodiment discussed below, there may be a difference in potential between filament 22 and the beam forming electrode 26. An anode 28 having a tip portion just above and oriented parallel to beam forming electrode 26 similarly extends the length of the filament 22, and is, but need not be, conductively attached to crucible 12 on the outside thereof. Electrode 28 is typically of copper material, while electrode 26 is typically of molybdenum composition. A control element such as rod 30 is positioned beside filament 22 on the opposite side thereof from the vertically extending portion of beam forming electrode 26 and at approximately the same height as filament 22. A bias power supply 32 is connected to control rod 30 for providing the required bias voltages as discussed below. Control rod 30 extends the length of and is spatially positioned parallel to filament 22. As shown in FIG. 1, control rod 30 comprises a cylindrical electrode, although other geometries may be employed such as, for example, the edge of a plate of sheet metal.

Proper consideration must be given to maintaining the geometrical integrity of the mechanical structure comprising the filament and the control rod. Since the space charge and, consequently, current density of the electron beam per unit length of the filament will be strongly dependent on the filament-control rod spacing, the control rod must be fabricated and supported in such a way that the geometrical relationship between the filament and control rod will not be significantly affected by thermal effects, such as radiant heating of the control rod by the filament. One suitable method for mounting a rod-shaped control element is to place one end thereof in a stationary support and to place the other end in a sliding support, to allow the rod to expand lengthwise as it heats, without changing the spacing between the filament and the rod.

Figure 2:
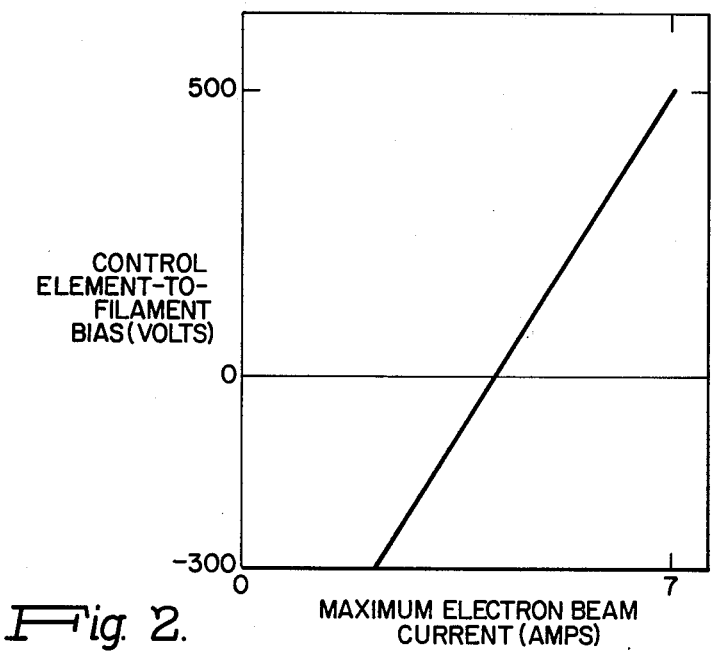
FIG. 2 is a plot showing how electron beam current varies with control rod bias according to the present invention.

As shown in FIG. 2, which depicts a typical plot of beam current and control rod bias for an assumed geometry, the total electron beam current is a direct function of rod-to-filament bias, or, equivalently, when the filament and beam former are connected, rod-to-beam former bias. Either positive or negative bias may be used, although it is desirable to have the rod biased negatively with respect to the filament, for safety reasons. Specifically, if the rod is biased positively with respect to the filament and the high voltage applied between the element and anode, typically about 30 kilovolts, becomes disabled, the electron beam current will then be attracted by the rod. Since the rod is preferably not constructed to carry currents of the magnitude of the electron beam current, which may, typically, be several amperes, this situation is to be avoided if possible, so as not to damage the rod structure. With such high anode-to-filament voltage present, the rod, even though it may be biased positively with respect to the filament, will not generally draw much current because the electrons emitted by the filament are accelerated upward and outward from the region in the filament before reaching the rod. Thus, while both positive and negative rod bias will result in the type of space charge control explained above, negative rod bias is generally to be preferred since electron beam current will then not be attracted by the rod even if the high voltage acceleration supply were to be disabled.

Figure 3:
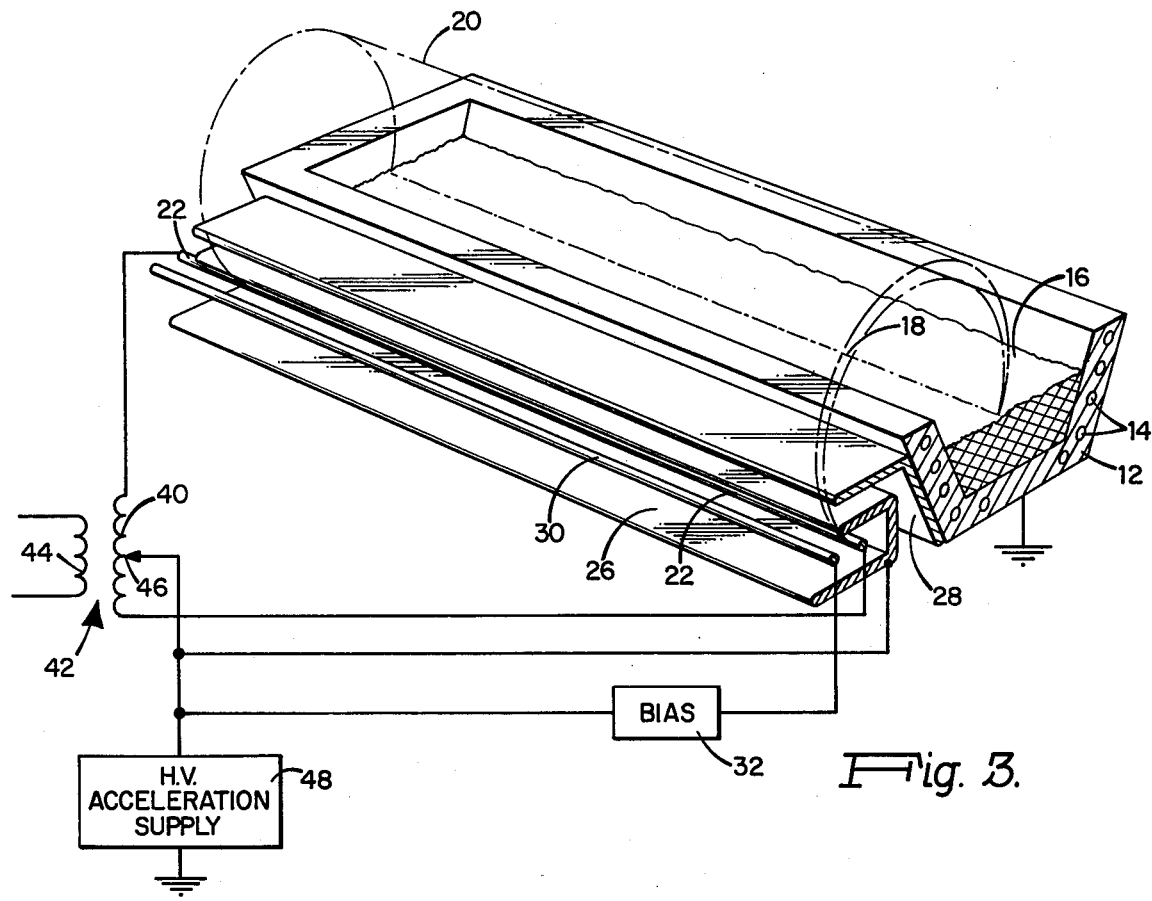
FIG. 3 is a combination block-pictorial-circuit diagram showing the electron gun electrode bias and power connections according to the present invention.

A more detailed understanding of the power supply and element bias requirements is possible by reference to FIG. 3. As shown therein, filament 22 is heated by connecting the opposite ends thereof across the secondary winding 40 of a transformer 42. The primary winding 44 of transformer 42 is connected to a source of A.C. power, not shown. Bias supply 32 is a fixed or variable D.C. power supply for biasing the control rod relative to the filament. A first lead from the bias supply is connected to control element 30, while a second lead is connected to a tap 46, preferably a center tap, on the secondary winding 40 of transformer 42. Beam former 26 is also connected to transformer tap 46 to maintain the beam former at about the same voltage as the filament. An acceleration high voltage power supply 48 connected between ground and the transformer tap maintains a potential on the order of 30 kilovolts between the crucible-anode and the filament-beam former, to accelerate the electrons emitted by the filament. Since the crucible is shown at ground potential, the output of high voltage supply 48 will be of negative polarity to achieve this result.

This invention has the further advantage that electron beam current density per unit length of the filament is a direct function of total filament current. Thus, it is possible to use a feedback-controlled rod bias source (sensing filament current) to maintain a stable, uniform, either fixed or variable, electron beam current density.

Figure 4:
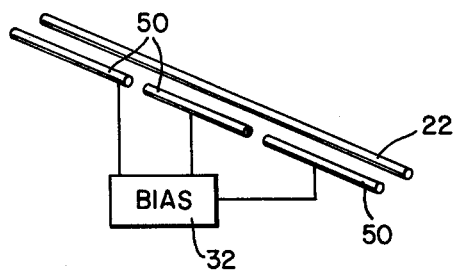
FIG. 4 is a pictorial diagram of a modification to the control rod structure.

One alternative application of the invention involves the use of either a nonlinear rod structure or multiple rod elements 50 (FIG. 4) in place of the single, rod-shaped element shown in FIG. 1, in order to introduce axial nonuniformities into the space charge field for the purpose of, for example, adding feed metal or correcting for the gaps in heat input which occur at the ends between adjacent electron guns.

Another alternative construction for the control element structure is to utilize the beam former electrode itself, suitably changed in shape, as the control element. Naturally, the beam former would not be connected to the filament in such a situation, as bias would be applied between the beam former and filament.

The above-described preferred embodiment and alternative embodiments for the present invention are illustrative forms only, alterations and modifications thereof being deemed to be within their scope and spirit. The breadth of the invention is intended to be limited only as defined in the following claims.

What is claimed is:

1. In a system for isotope separation, means for providing a vapor flow of generally elongate configuration from a mass of material to be evaporated, said means comprising:
   means for vaporizing said material along a narrow linear path; and
   means for providing a substantially uniform vapor density from point to point along any line parallel to said narrow linear path of vaporization.

2. An electron beam source for generating a focused electron beam, comprising:
   an elongated, generally linear filament;
   means for focusing electron beam radiation from said filament to a narrow line; and
   non-emissive means for providing substantially uniform density of emission of electron current along the length of the filament.

3. The electron beam source of claim 2 wherein said means for providing a substantially uniform density of emission of electron current comprises a control electrode.

4. The electron beam source of claim 3 wherein said control electrode comprises a rod positioned approximately parallel to the filament and spaced apart therefrom.

5. An electron beam source for generating an electron beam comprising:
   an elongated, generally linear filament; and
   a plurality of means for controlling emission from said filament, said means each providing a substantially uniform density of emission of electron current along the length of said filament over a limited portion of said filament.

6. The electron beam source of claim 5 wherein each of said means for controlling emission comprises a control element.

7. The electron beam source of claim 6 wherein each of said control element comprises a rod positioned approximately parallel to the filament and spaced apart therefrom.

8. The method of providing a line-vapor source of molecules or atoms of a substance to be vaporized comprising the steps of:
   heating an elongated, generally linear filament to emit electrons therefrom;
   space charge limiting the filament electron emission over the length thereof to provide uniformity of electron beam current emitted by the filament per unit length thereof; and
   focusing the electron beam so generated to impinge upon the material to be vaporized in a narrow line.

9. A linear electron beam source with a controlled beam emissivity comprising:
   an elongated generally linear electron emissive element;
   means for generating an arcuate-shaped electron beam from said element; and
   means operative in association with said electron emissive element for limiting the emission of electrons from said element in said beam independent of the local emissivity of said element.

10. The electron beam source of claim 9 wherein said limiting means includes means for providing a predetermined distribution of electron beam density along the linear dimension of said element.

11. The electron beam source of claim 10 wherein said predetermined density distribution is uniform along at least a portion of the linear extent of said element.

12. The electron beam source of claim 9 wherein said control means includes a linear beam forming electrode spaced apart from and extending generally the linear extent of said emissive element.

13. The electron beam source of claim 9 further including:
   means for operating said electron emissive element in an electron emitting condition; and
   means for energizing said limiting means at a potential relative to said electron emissive element to establish a space charge limited emission of electrons therefrom.

14. The electron beam source of claim 13 further including:
   means for detecting electron emission beam flow current from said emissive element; and
   means responsive to detecting beam current for controlling the space charge limited electron emission from said element.

15. The electron beam source of claim 9 further including a reservoir of a material being evaporated by said beam whereby vapor particles tend to coat said element nonuniformly changing the emissivity of said element but without substantially changing the electron emission of said element.

* * * * *